US010797190B2

(12) United States Patent
Topping (10) Patent No.: US 10,797,190 B2
(45) Date of Patent: Oct. 6, 2020

(54) ASYMMETRIC GROOVE

(71) Applicant: POWER ROLL LIMITED, Sunderland (GB)

(72) Inventor: Alexander John Topping, Sunderland (GB)

(73) Assignee: POWER ROLL LIMITED, Sunderland (GB)

(*) Notice: Subject to any disclaimer, the term of this patent is extended or adjusted under 35 U.S.C. 154(b) by 0 days.

(21) Appl. No.: 16/091,600

(22) PCT Filed: Apr. 6, 2017

(86) PCT No.: PCT/GB2017/050974
§ 371 (c)(1),
(2) Date: Oct. 5, 2018

(87) PCT Pub. No.: WO2017/174997
PCT Pub. Date: Oct. 12, 2017

(65) Prior Publication Data
US 2019/0088807 A1  Mar. 21, 2019

(30) Foreign Application Priority Data
Apr. 7, 2016 (GB) ..................... 1605918

(51) Int. Cl.
*H01L 31/0352* (2006.01)
*H01L 31/0224* (2006.01)
(Continued)

(52) U.S. Cl.
CPC ............. *H01L 31/035281* (2013.01); *H01L 31/022425* (2013.01); *H01L 31/072* (2013.01); *Y02E 10/50* (2013.01)

(58) Field of Classification Search
CPC ............ H01L 31/0216; H01L 31/0236; H01L 31/02366; H01L 31/02363; H01L 31/0352;
(Continued)

(56) References Cited

U.S. PATENT DOCUMENTS 3,948,682 A   4/1976  Bordina et al.
4,110,122 A   8/1978  Kaplow et al.
(Continued)

FOREIGN PATENT DOCUMENTS

DE   19943720   5/2000
DE   19937724   12/2000
(Continued)

OTHER PUBLICATIONS

Kilmova et al. "High-Voltage Photovoltaic Cells with Alloyed Aluminum Contacts." Applied Solar Energy, 1992, 28(3), 20-24.
(Continued)

*Primary Examiner* — Susan D Leong
(74) *Attorney, Agent, or Firm* — Meunier Carlin & Curfman LLC (57) ABSTRACT

An optoelectronic device comprising a substrate comprising a groove having a first and a second face. The first face of the groove is coated with a semiconductor material and the second face of the groove is coated with a conductor material. The conductor material and the semiconductor material are in contact with another semiconductor material in the groove. The first face of the groove is longer than the second face of the groove or the second face of the groove is longer than the first face of the groove.

20 Claims, 2 Drawing Sheets

(51) Int. Cl.
  *H01L 31/0216* (2014.01)
  *H01L 31/047* (2014.01)
  *H01L 31/05* (2014.01)
  *H01L 31/072* (2012.01)

(58) Field of Classification Search
  CPC .................. H01L 31/047; H01L 31/05; H01L 31/035281
  See application file for complete search history.

(56) References Cited

U.S. PATENT DOCUMENTS

| | | |
|---|---|---|
| 4,283,589 A | 8/1981 | Kaplow et al. |
| 4,295,002 A | 10/1981 | Chappell et al. |
| 4,335,503 A | 6/1982 | Evans et al. |
| 4,376,872 A * | 3/1983 | Evans ............... H01L 31/03529 136/249 |
| 4,379,944 A | 4/1983 | Borden et al. |
| 5,067,985 A | 11/1991 | Carver et al. |
| 5,147,468 A | 9/1992 | Deguchi |
| 5,689,358 A | 11/1997 | Nakao et al. |
| 6,084,175 A | 7/2000 | Perry et al. |
| 6,090,661 A | 7/2000 | Perng et al. |
| 6,762,359 B2 | 7/2004 | Asai et al. |
| 2004/0238833 A1 | 12/2004 | Nakata |
| 2005/0022860 A1 | 2/2005 | Toh et al. |
| 2005/0115602 A1 | 6/2005 | Senta et al. |
| 2007/0034250 A1 | 2/2007 | Dutta |
| 2008/0202581 A1 | 8/2008 | Kempa et al. |
| 2009/0014056 A1 | 1/2009 | Hockaday |
| 2010/0089443 A1 | 4/2010 | Bloomstein et al. |
| 2010/0244056 A1 | 9/2010 | Ray et al. |
| 2010/0275964 A1 | 11/2010 | Kinoshita |
| 2010/0285631 A1 * | 11/2010 | McCann ............... H01L 31/18 438/98 |
| 2010/0294536 A1 | 11/2010 | Usami |
| 2010/0294539 A1 | 11/2010 | Sasaki et al. |
| 2011/0036391 A1 | 2/2011 | McMormick et al. |
| 2011/0290323 A1 | 12/2011 | Lee et al. |
| 2012/0080087 A1 | 4/2012 | Denby |
| 2012/0298175 A1 | 11/2012 | Van Roosmalen et al. |
| 2013/0160818 A1 | 6/2013 | Li et al. |
| 2013/0298980 A1 | 11/2013 | Fogel et al. |
| 2014/0238461 A1 | 8/2014 | Luo et al. |
| 2015/0132949 A1 | 5/2015 | Lin et al. |
| 2015/0372176 A1 | 12/2015 | Topping |
| 2016/0064583 A1 * | 3/2016 | Smith ............. H01L 31/035281 136/246 |

FOREIGN PATENT DOCUMENTS

| | | |
|---|---|---|
| EP | 1427026 | 6/2004 |
| EP | 2256820 | 12/2010 |
| GB | 2210462 | 6/1989 |
| JP | S6135573 | 2/1986 |
| JP | 2010529599 | 8/2010 |
| JP | 2012049542 | 3/2012 |
| WO | 2002059981 | 8/2002 |
| WO | 2007124725 | 11/2007 |
| WO | 2011034908 | 3/2011 |
| WO | 2012175902 | 12/2012 |
| WO | 2014118545 | 8/2014 |
| WO | 2015145166 | 10/2015 |
| WO | 2017174993 | 10/2017 |
| WO | 2017174996 | 10/2017 |

OTHER PUBLICATIONS

International Search Report and Written Opinion dated Jun. 23, 2017 in International Application No. PCT/IB2017/050968 (10 pages).

International Search Report and Written Opinion dated Jun. 23, 2017 in International Application No. PCT/IB2017/050972 (10 pages).

International Search Report and Written Opinion dated Jun. 23, 2017 in International Application No. PCT/IB2017/050974 (11 pages).

Hezel R. "Novel back contact silicon solar cells designed for very high efficiencies and low-cost mass production," Conference Record of the 29th IEEE Photovoltaic Specialists Conference 2002, vol. 29, May 19, 2002-May 24, 2002, pp. 114-117.

Sturm et al. "Chemical Vapor Deposition Epitaxy of Silicon-based Materials using Neopentasilane," ECS Transactions, 2008, 16(10), 799-805.

Wronski "Schottky-barrier characteristics of metal-amorphous-silicon diodes," Applied Physics Letters, 1975, 29(9), 1.

Michael Niggemann, Thesis, Fundamental Investigations on Periodic Nano- and Microstructured Organic Solar Cells, Mar. 2005, Albert-Ludwigs University of Freiburg, Germany.

* cited by examiner

ASYMMETRIC GROOVE

The present invention relates to an optoelectronic device and more specifically a solar photovoltaic cell.

The term photovoltaic refers to the production of electricity, normally direct electrical current, from light at the junction between two materials that are exposed to the light. The light is normally sunlight and therefore photovoltaic is often referred to as solar photovoltaic. It is known to use semiconductors for the two materials. The semiconductor materials used exhibit a photovoltaic effect.

The two semiconductors are usually a p-type and an n-type semiconductor material. When joined together the boundary or interface between the two types of semiconductor material is referred to as a p-n junction. This type of p-n junction is usually created by doping one material with the other material. The doping may be by diffusion, ion implantation or epitaxy.

A p-n junction can be found in most optoelectronic devices that use semiconductors. These optoelectronic devices include photovoltaic or solar photovoltaic cells, diodes, light-emitting diodes (LEDs) and transistors. The p-n junction can be thought of as the active site where the generation or consumption of electrical energy occurs.

The demand for sources of renewable energy has driven significant improvements in the cost and efficiency of solar photovoltaic cells but existing technology still represents a relatively expensive method of generating electricity. Also, existing solar photovoltaic cells are relatively inefficient compared to other methods of generating electricity and are relatively fragile, that is they are relatively easily damaged.

The present invention aims to mitigate one or more of the disadvantages of existing solar photovoltaic cells.

In accordance with a first aspect of the present invention there is provided an optoelectronic device comprising:
- a substrate comprising a groove having a first and a second face;
- the first face of the groove coated with a semiconductor material and the second face of the groove coated with a conductor material;
- the semiconductor material and the conductor material in contact with another semiconductor material in the groove; and
- wherein first face of the groove is longer than the second face of the groove or the second face of the groove is longer than the first face of the groove.

When the first face of the groove is longer than the second face of the groove the first face is typically at least 1000 nm long and the second face is typically at least 300 nm long. When the second face of the groove is longer than the first face of the groove the second face is typically at least 1000 nm long and the first face is typically at least 300 nm long.

When the first face of the groove is longer than the second face of the groove or the second face of the groove is longer than the first face of the groove, the groove typically has an asymmetric shape.

The length of the first face of the groove is normally measured from a junction between the first face of the groove and the first surface of the substrate and a junction between the first and second faces of the groove. The length of the second face of the groove is normally measured from a junction between the second face of the groove and the second surface of the substrate and a junction between the second and first faces of the groove.

Preferably the first face of the groove is longer than the second face of the groove. The first face of the groove is typically at least twice the length of the second face of the groove.

A first side of the groove typically comprises the first face of the groove and a first surface of the substrate adjacent the groove. A second side of the groove typically comprises the second face of the groove and a second surface of the substrate adjacent the groove. The first and second surfaces adjacent the groove are typically at least substantially parallel with and/or in the same plane as the substrate. The first and second side of the groove are typically on the same surface of the substrate.

The first and second sides of the groove are normally each coated with a conductor material and a semiconductor material. The semiconductor material on the first side of the groove and the conductor material on the second side of the groove are typically in contact with the another semiconductor material in the groove.

At the second side of the groove there is typically a gap between the semiconductor material on the second side of the groove and the another semiconductor material in the groove.

It may be an advantage of the present invention that, in use, the gap between the semiconductor material on the second side of the groove and the another semiconductor material in the groove one or more of stops, mitigates and substantially reduces the occurrence of shunting across the groove and therefore typically between the first and second sides of the groove.

The gap is typically an air gap. The gap may be filled with another material, preferably a non-conducting and/or electrically insulative material. The gap is typically a form of electrical insulation between the semiconductor material on the second side of the groove and the another semiconductor material in the groove.

The gap between the semiconductor material and the another semiconductor material at the second side of the groove, typically means that the another semiconductor material is not in contact and/or is insulated from, the semiconductor material.

The gap between the semiconductor material on the second side of the groove and the another semiconductor material in the groove may be at least 1 nm in length, normally at least 20 nm in length and typically at least 100 nm in length.

It may be an advantage of the present invention that the gap makes the optoelectronic device less susceptible, typically resistant to shorting and/or shunting across the groove. The gap in between the semiconductor and the another semiconductor material is designed to mitigate a charge transfer path/route from the semiconductor material on one side of the groove, through the another semiconductor and into the semiconductor material on the opposite side of the groove. This typically makes the optoelectronic device less susceptible to shunting.

The inventors of the present invention have, in this context, appreciated that the optoelectronic device should ideally provide an electrical pathway between a conductor material and semiconductor material through another semiconductor material. The inventors of the present invention have, in this context, also appreciated that an electrical pathway or junction between two portions of the same semiconductor material through another semiconductor material is undesirable.

Shunting is a parasitic parallel resistance across the optoelectronic device. Maximising shunt resistance makes the optoelectronic device more efficient. A higher shunting resistance reduces the occurrence of shunting. The gap between the semiconductor and the another semiconductor material typically minimises the structural shunting effects and this reduces the deleterious effect of shunting on the optoelectronic device.

Shunting also typically includes counter-electromotive forces EMF or CEM F. These back electromotive forces are the electromotive forces or voltage that push against the desired current which is generated on the face coated with the semiconductor. The counter-electromotive forces are typically produced by the electrical pathway between two portions of the same semiconductor material through another semiconductor material.

This electrical pathway or connection will typically produce two diodes in opposite directions. One diode will typically have a greater, normally much greater, area and this diode will normally dominate the function of the device. This may be due in part to its relative size and in part to the possible path through the conductor material.

The first face of the groove is normally at a first angle relative to a normal from the substrate and the second face of the groove is normally at a second angle relative to the normal from the substrate. The first angle is normally 25 to less than or equal to 90°. The second angle is normally from 45 to less than or equal to 90°.

The first and the second face of the groove typically define a cavity of the groove therebetween.

The first and second faces of the groove may each have a first and a second end. The first ends are typically in contact at the centre of the groove and/or bottom of the cavity, the second ends detached at a top of the cavity. In an alternative embodiment the first and second faces separately contact a base of the groove. The base of the groove may be a bottom of the groove.

The semiconductor material may be a layer of semiconductor material. The conductor material may be a layer of conductor material. The layer of semiconductor material is typically on top of the layer of conductor material. The layer of conductor material is typically underneath the layer of semiconductor material. The conductor material is normally in contact with one or more of the first face, first surface, second face and second surface of the groove and the semiconductor material.

The conductor material is normally one or more of on, in contact with and coated on the second face of the groove and second surface of the substrate adjacent the groove.

The conductor material may further be one or more of on, in contact with and coated on the first surface of the substrate adjacent the groove.

The semiconductor material is normally one or more of on, in contact with and coated on the first face of the groove and first surface of the substrate adjacent the groove.

The semiconductor material may further be one or more of on, in contact with and coated on the second surface of the substrate adjacent the groove.

The first and/or second sides of the groove may each be coated with an adhesive material. The adhesive material may be a layer of adhesive material. The layer of adhesive material is typically in contact with one or more of the first face, first surface, second face and second surface of the groove, the conductor material and the semiconductor material.

The adhesive material may also be a conductor, typically an electrical conductor. The conductor material coated on the first face of the groove and the adhesive material may be the same material and/or the same layer.

The another semiconductor typically at least partially fills the groove and/or fills the groove between the first and second faces of the groove.

The another semiconductor in the groove may be referred to as having a surface between the first and second faces of the groove. The surface of the another semiconductor is typically not parallel and normally not substantially parallel to the plane of the substrate. The surface of the another semiconductor is typically at an angle and/or tilted with respect to the plane of the substrate.

The surface of the another semiconductor may be inclined or declined relative to a normal from the substrate. The surface of the another semiconductor may be non-normal to a normal from the substrate. When the surface of the another semiconductor is one or more of inclined or declined and non-normal relative to a normal from the substrate, the surface of the another semiconductor may be referred to as tilted relative to the groove.

The depth of the another semiconductor material in the groove at the second face may be greater than the depth of the another semiconductor material at the first face. The depth of the another semiconductor will typically depend on the shape of the groove. The depth of the another semiconductor material at the second side of the groove may be greater than the depth of the another semiconductor material at the first side of the groove because the groove has an asymmetric shape.

The groove may be any shape, typically an asymmetric v-shape.

The another semiconductor material typically contacts only the first face of the groove and/or the semiconductor material on the first side of the groove and the another semiconductor contacts only the second face of the groove and/or the conductor material on the second side of the groove.

The semiconductor material may coat and/or cover from 20 to 80%, normally from 40 to 60% and optionally about 50% of the first face of the groove. The semiconductor material may coat and/or cover about 75% of the first face of the groove. The conductor material may coat and/or cover from 20 to 80%, normally from 40 to 60% and optionally about 50% of the second face of the groove. The conductor material may coat and/or cover about 75% of the second face of the groove.

It may be an advantage of the present invention that when the conductor material and/or semiconductor material coat and/or cover about 50%, preferably about 75%, of the second face and/or first face of the groove respectively, one or more of the efficiency, electrical current generated, power output and photoelectric conversion efficiency of the optoelectronic device is increased.

The coat of the conductor material and/or semiconductor material may be from 20 nm to 1000 nm thick, normally from 25 nm to 500 nm thick and typically from 30 nm to 200 nm thick. The coat of the conductor material and/or semiconductor material may therefore be referred to as a relatively thin coating.

It may be an advantage of the present invention that when the another semiconductor thickness is about 200 nm, one or more of the efficiency, electrical current generated, power output and photoelectric conversion efficiency of the optoelectronic device is increased. When the another semiconductor thickness is about 200 nm, the width of the groove may be about 1 μm, although this may vary for different groove shapes.

There is typically an aperture in the another semiconductor material.

It may be an advantage of the present invention that the aperture makes the optoelectronic device less susceptible to shorting and/or shunting across the groove. The aperture in the another semiconductor material typically increases the length of a charge transfer path/route across the top of the groove and this makes the optoelectronic device less susceptible to shunting.

The another semiconductor material typically has a first surface substantially parallel to the first face of the groove and a second surface substantially parallel to the second face of the groove, the first and second surfaces defining the aperture in the another semiconductor material.

The aperture may be referred to as a gap and/or crack. The shape of the aperture is typically substantially conformal with the shape of the groove. The shape of the aperture may match the shape of the groove.

The first and second surfaces of the another semiconductor may be referred to as sides of the aperture. The sides of the aperture may be substantially parallel to the first and second faces of the groove respectively. The sides of the aperture may be steeper or shallower than the first and/or second faces of the groove but are still considered substantially parallel.

The first and the second face of the groove typically define a cavity of the groove therebetween. The aperture normally extends down into the cavity. The aperture typically extends down into the cavity between the first and second face of the groove.

The another semiconductor material may occupy from 10 to 95%, optionally from 15 to 75%, normally from 25 to 50% and may be 75% of the volume of the cavity of the groove. When for example the another semiconductor material occupies 75% of the volume of the cavity, a remaining 15% corresponds to the aperture in the another semiconductor material. The conductor material and semiconductor material account for the remaining volume. The volume of the cavity occupied by the another semiconductor material may be related to the shape of the groove.

The aperture in the another semiconductor material may extend up to 90%, optionally up to 60% and typically from 40 to 60% of the distance into the cavity of the groove. It may be an advantage of the present invention that a crack in the semiconductor material that extends about 50% of the distance into the cavity from the top of the cavity may increase the electrical current generated by the optoelectronic device. The distance the crack in the semiconductor material extends into the cavity from the top of the cavity may be related to the shape of the groove.

The semiconductor material on the second surface of the substrate adjacent the groove and therefore on the second side of the groove may be coated with an insulator material. The insulator material is typically on top of the semiconductor material.

It may be an advantage of the present invention that the insulator material makes the optoelectronic device less susceptible to shorting and/or shunting across the groove. The insulator material normally insulates, typically electrically insulates, the semiconductor material on the second surface of the substrate adjacent the groove from the another semiconductor in the groove. The insulator material may increase the length of and/or mitigate a charge transfer path/route across the top of the groove and this typically makes the optoelectronic device less susceptible to shunting. The insulator material is typically an electrical insulator material. The insulator material may comprise a low surface energy material such as polytetrafluoroethylene (PTFE).

During manufacture of the optoelectronic device, the insulator material may repel the another semiconductor material when the another semiconductor material is being deposited in the groove. This may increase a distance and/or gap between the semiconductor material on the second surface of the substrate adjacent the groove and the another semiconductor in the groove.

It may be an advantage of the present invention that an increase in the distance and/or gap between the semiconductor material on the second surface of the substrate adjacent the groove and the another semiconductor in the groove makes the optoelectronic device less susceptible to shunting.

The semiconductor material is typically an n-type semiconductor material. The another semiconductor material is typically a p-type semiconductor material. In an alternative embodiment the semiconductor material is a p-type semiconductor material and the another semiconductor material is an n-type semiconductor material.

The n-type and p-type semiconductors may comprise one or more of silicon, amorphous silicon, hydrogenated amorphous silicon, aluminium, germanium, gallium nitride, gallium arsenide, aluminium phosphide, aluminium arsenide, copper iodide, zinc oxide, lead sulphide, selenium, boron phosphide, boron arsenide, gallium, indium nitride, indium phosphide, cadmium selenide, cadmium sulphide, cadmium telluride, zinc sulphide, zinc selenide, zinc telluride, copper chloride, copper sulphide, copper oxide, tin sulphide, tin telluride, zinc phosphide, titanium oxide, tin oxide, lithium niobate, lead iodide, gallium selenide, tin sulphide, iron oxide, nickel oxide, copper indium selenide, copper zinc tin sulphide, iron disulphide and copper zinc antimony sulphide.

The n-type semiconductor typically comprises one or more of silicon, germanium, phosphorus, selenium, tellurium, cadmium sulphide, zinc, indium, tin, oxides of the above and doped semiconducting oxides.

The p-type semiconductor typically comprises one or more of silicon, germanium, cadmium telluride, copper indium gallium selenide ('CIGS'), copper indium gallium diselenide, copper indium selenide (CIS), copper gallium selenide, copper oxide, boron, beryllium, zinc, cadmium, copper zinc tin sulphide (CZTS), perovskite, calcium titanium oxide, calcium titanate and lead sulphite.

The another semiconductor material may be an electron blocking material such as molybdenum trioxide. The electron blocking material may be a hole transporting, electron blocking material, such as vanadium pentoxide, tantalum pentoxide, spiro-polymers, and p-dot polymers. The semiconductor material may be a heterojunction, that is a mixture of one or more of a p-type semiconductor, n-type semiconductor and donor acceptor material.

The semiconductor and another semiconductor materials may meet at an interface and/or boundary. The interface is typically referred to as a p-n junction. The semiconductor and another semiconductor materials may together be referred to as an active material. The semiconductor and the another semiconductor are typically different materials.

The conductor material is typically ohmic and/or an ohmic contact to the another semiconductor material. The semiconductor material is typically rectifying and/or a rectifying contact to the another semiconductor material.

The active material in the groove and/or in the cavity of the groove and on the first and second faces of the groove may provide ohmic and rectifying contacts for insertion or extraction of charge from the active material. The active material may be one or more of photovoltaic, light emitting and ion conducting.

The conductor material may be an electrical conductor. The conductor material may comprise one or more of aluminium, bismuth, cadmium, chromium, copper, gallium, gold, indium, lead, magnesium, manganese, samarium, scandium, silver, tin, zinc, terbium, selenium, molybdenum, yttrium, holmium, calcium, nickel, tungsten, platinum, palladium and vanadium.

The substrate may comprise a first and a second series of grooves and a channel therebetween. The groove referred to above may be any one of the grooves of the first and/or second series of grooves. The channel typically transects the grooves of the first and second series of grooves.

It may be an advantage of the present invention that the channel separates the first and second series of grooves such that an electrical current can be taken from or supplied to the first series of grooves in isolation from the second series of grooves.

The first and second series of grooves are typically elongate grooves. The channel between the first and second series of grooves is typically an elongate channel.

The channel typically transects the grooves of the first and second series of grooves at or towards an end of each groove. The channel typically transects or crosses the grooves of the first series of grooves towards an end of each groove and then passes between the first and second series of grooves before transecting or crossing the grooves of the second series of grooves towards an opposite and/or opposing end of each groove.

Normally a portion, normally a substantial portion, of the first and second series of grooves and channel therebetween are substantially parallel, typically parallel to one another.

The channel may extend both perpendicular to and parallel to the first and second series of grooves. Normally the channel is perpendicular to the first and second series of grooves when it extends across the ends of the first and second series of grooves. Normally the channel is parallel to the first and second series of grooves when it extends between the first and second series of grooves. The angle at which the channel may extend across the ends of the first and second series of grooves can be variable and optionally be from 0 to 90°, normally from 35 to 55° and typically be 45°.

When the channel extends both perpendicular to and parallel to the first and second series of grooves, the channel may be referred to as running in at least two directions to connect said first and second series of grooves.

When the channel extends substantially perpendicular and across the ends of the first and second series of grooves, it may also extend in at least two directions relative to the first and second series of grooves. When the channel extends in at least two directions relative to the first and second series of grooves it typically forms a zigzag shape.

A surface of the substrate comprising the groove may be referred to as a structured surface. The structured surface is typically not flat. The substrate may have another surface that is flat.

The channel may be referred to as a delineation feature. The channel typically separates the first and second series of grooves. The channel typically has a first and a second side. The first side of the channel typically comprises a first face of the channel and a first surface of the substrate adjacent the channel. The second side of the channel typically comprises a second face of the channel and a second surface of the substrate adjacent the channel. The first and second surfaces adjacent the channel are typically at least substantially parallel with and/or in the same plane as the substrate. The first and second side of the channel are typically on the same surface of the substrate. The first and second sides of the channel are typically coated with the conductor material and the semiconductor material.

There is typically a channel cavity between the first and second faces of the channel.

The first face of the channel is typically at a first angle relative to a normal from the substrate and the second face of the channel is typically at a second angle relative to a normal from the substrate. The first face of the channel and the second face of the channel may be perpendicular to the plane of the substrate. The first angle is normally from 45 to less than or equal to 90°. The second angle is normally from 45 to less than or equal to 90°.

There is usually no electrical communication between the conductor material on the second side and/or face of the channel, semiconductor material on the first side and/or face of the channel and the another semiconductor material in the channel.

A first side and a second side of the channel may provide the positive and negative poles of an electrical circuit. The first side of the channel may be in electrical communication, typically attached to, the positive or negative pole of the electrical circuit. The second side of the channel may be in electrical communication, typically attached to, the other pole, that is the negative or positive pole respectively of the electrical circuit.

The channel is typically non-conductive. The channel typically separates and/or insulates the first and second sides of the channel from one another.

The optoelectronic device may be referred to as a two terminal device. The first and second series of grooves may be referred to as cascaded groove structures. In use the device may be fabricated in a series arrangement and operated in a parallel or a combined series and parallel arrangement.

The channel cavity between the first and second faces of the channel may be any shape and is normally U-shaped, V-shaped or semi-spherical. The channel cavity between the first and second faces of the channel may have a flat bottom. The shape of the cavity between the first and second faces of the first and second series of grooves may be the same or different to the shape of the channel cavity between the first and second faces of the channel.

The shape of the channel may be same or may be different to the shape of the groove.

The bottom of the channel cavity may be flat or may be rutted. The rutted bottom of the channel cavity may be referred to as uneven or rough. The rutted bottom of the channel cavity typically increases the surface area of the bottom of the channel cavity.

Increasing the surface area of the bottom of the channel cavity may help to ensure the channel separates and/or insulates the first and second sides of the channel from one another.

The channel and grooves of the first and second series of grooves typically have a depth measured from an upper surface of the substrate to a point in the channel or groove furthest from the upper surface.

The depth of the channel is typically greater than the depth of the grooves of the first and second series of grooves. The depth of the channel may be at least twice the depth of the grooves of the first and second series of grooves.

The channel has a depth and a width. The depth of the channel is typically twice the width of the channel. The aspect ratio for the depth to the width of the channel is therefore typically about 2:1.

The first and second series of grooves typically form a series of ridges and cavities. The first and second series of grooves may comprise at least 2 cavities, typically from 2 to 500 cavities.

Each groove and/or the grooves of the first and second series of grooves is typically from 5 to 200 mm long, normally from 5 to 1000 mm long and preferably 330 mm long. Each groove and/or the grooves of the first and second series of grooves is typically from 0.3 to 100 μm wide, normally from 0.3 to 5 μm wide.

The substrate may comprise a curable resin and in particular a UV curable resin. The substrate may comprise one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The optoelectronic device is typically a solar photovoltaic cell.

The optoelectronic device may be one or more of attached, secured and applied to a vehicle, for example a car or lorry, a building, for example a roof, and any other surface of a structure. The structure may be man-made or natural.

A surface that the optoelectronic device is one or more of attached, secured and applied to may be flat or uneven, that is one or more of rough, bumpy, irregular and/or rutted.

Embodiments of the invention will now be described by way of example only and with reference to the accompanying drawings, in which.

Figure 1:
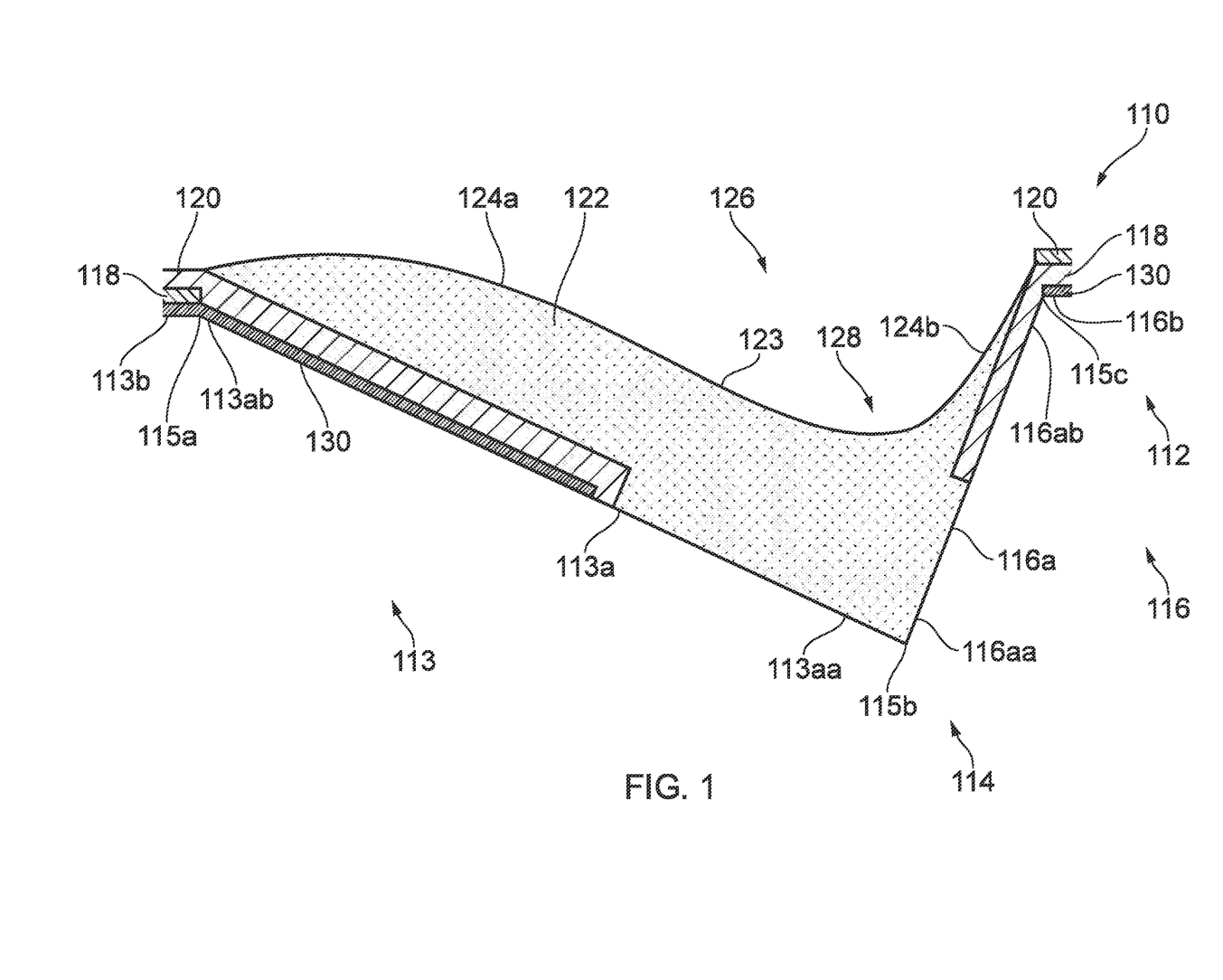
FIG. 1 is a cross-sectional view of a groove of an optoelectronic device according to a first embodiment of the present invention.

FIG. 1 shows an optoelectronic device 110 comprising a substrate 112 comprising a groove 114 having a first 113a and a second 116a face. The first face 113a of the groove 114 is coated with a semiconductor material 120 and the second face 116a of the groove 114 is coated with a conductor material 118. The semiconductor material 120 and the conductor material 118 are in contact with another semiconductor material 122 in the groove 114. The first face 113a of the groove 114 is longer than the second face 116a of the groove 114.

The first 113a and the second 116a face of the groove 114 define a cavity 126 of the groove 114 therebetween. The first 113a and second 116a faces of the groove 114 each have a first 113aa, 116aa and a second 113ab, 116ab end. The first ends 113aa, 116aa are in contact at the centre of the groove 114 and bottom of the cavity 126; and the second ends 113ab, 116ab are detached at the top of the cavity 126.

The groove 114 is v-shaped. The groove 114, the another semiconductor material 122 and the cavity 126 are all asymmetrical.

A first side 113 of the groove 114 comprises the first face 113a of the groove 114 and a first surface 113b of the substrate 112 adjacent the groove 114. A second side 116 of the groove 114 comprises the second face 116a of the groove 114 and a second surface 116b of the substrate 112 adjacent the groove 114. The first and second surfaces 113b, 116b adjacent the groove 114 are in the same plane as the substrate 112.

The first face 113a of the groove 114 is longer than the second face 116a of the groove 114. The length of the first face 113a of the groove 114 is measured from a junction 115a between the first face 113a of the groove 114 and a first surface 113b of the substrate 112 and a junction 115b between the first and second faces 113a, 116a of the groove 114. The length of the second face 116a of the groove 114 is measured from a junction 115c between the second face 116a of the groove 114 and a second surface 116b of the substrate 112 and the junction 115b between the second and first faces 116a, 113a of the groove 114.

The first face 113a has a shallower slope, that is a lesser angle relative to the longitudinal axis of the substrate 112, than the second face 116b.

The optoelectronic device 110 further comprises an adhesive layer 130 comprising aluminium and/or chromium. The adhesive layer 130 may also be a conducting layer. The first 113 and second 116 sides of the groove 114 are each coated with the adhesive material 130. The adhesive layer 130 is in contact with the first face 113a, first surface 113b, and second surface 116b of the groove 114, the conductor material 118 and the semiconductor material 120.

The semiconductor material 120 is a layer of semiconductor material. The conductor material 118 is a layer of conductor material. The layer of semiconductor material 120 is on top of the layer of conductor material 118. The layer of conductor material 118 is underneath the layer of semiconductor material 120. The layer of adhesive material 130 is underneath the layer of conductor material 118 and the layer of layer of semiconductor material 120.

The conductor material 118 is in contact with the second face 116a of the groove 114. The conductor material 118 is coated on the first surface 113b of the substrate 112 adjacent the groove 114 and the second surface 116b of the substrate 112 adjacent the groove 114.

The semiconductor material 120 is coated on the first face 113a of the groove 114 and first surface 113b of the substrate 112 adjacent the groove 114. The semiconductor material 120 is also coated on the second surface 116b of the substrate 112 adjacent the groove 114.

The another semiconductor 122 partially fills the groove 114 between the first 113a and second 116a faces of the groove 114. The another semiconductor 122 in the groove 114 has a surface 123 between the first 113a and second 116a faces of the groove 114. The surface 123 of the another semiconductor 122 is not parallel to the plane of the substrate 112. The surface 123 of the another semiconductor 122 is tilted with respect to the plane of the substrate 112.

The another semiconductor material 122 contacts the first face 113a of the groove 114 and the semiconductor material 120 on the first side 113 of the groove 114. The another semiconductor 122 also contacts the second face 116a of the groove 114 and the conductor material 118 on the second side 116 of the groove 114.

There is an aperture 128 in the another semiconductor material 122 which extends down into the cavity 126 between the first 113a and second 116a faces of the groove 114. The another semiconductor material 122 has a first surface 124a substantially parallel to the first face 113a of the groove 114 and a second surface 124b substantially parallel to the second face 116a of the groove 114, the first 124a and second 124b surfaces defining the aperture 128 in the another semiconductor material 122.

The shape of the aperture 128 matches the shape of the groove 114. The first 124a and second 124b surfaces of the another semiconductor 122 are sides of the aperture 128. The sides 124a, 124b of the aperture 128 are substantially parallel to the first 113a and second 116a faces of the groove 114 respectively.

The aperture 128 is located off-centre, that is the aperture 128 is located closer to the second face 116a of the groove 114 and farther from the first face 113a of the groove 114, such that the thickness of the another semiconductor 122 is thicker at the first face 116a of the groove 114 and thinner at the second face 116a of the groove 114. The depth of the another semiconductor material 122 at the second side 116 of the groove 114 is greater than the depth of the another semiconductor material 122 at the first side 113 of the groove 114 because the groove 114 has an asymmetric shape.

The another semiconductor material 122 occupies 75% of the volume of the cavity 126 of the groove 114. The aperture 128 in the another semiconductor material 122 extends 45% of the distance into the cavity 126 of the groove 114.

Figure 2:
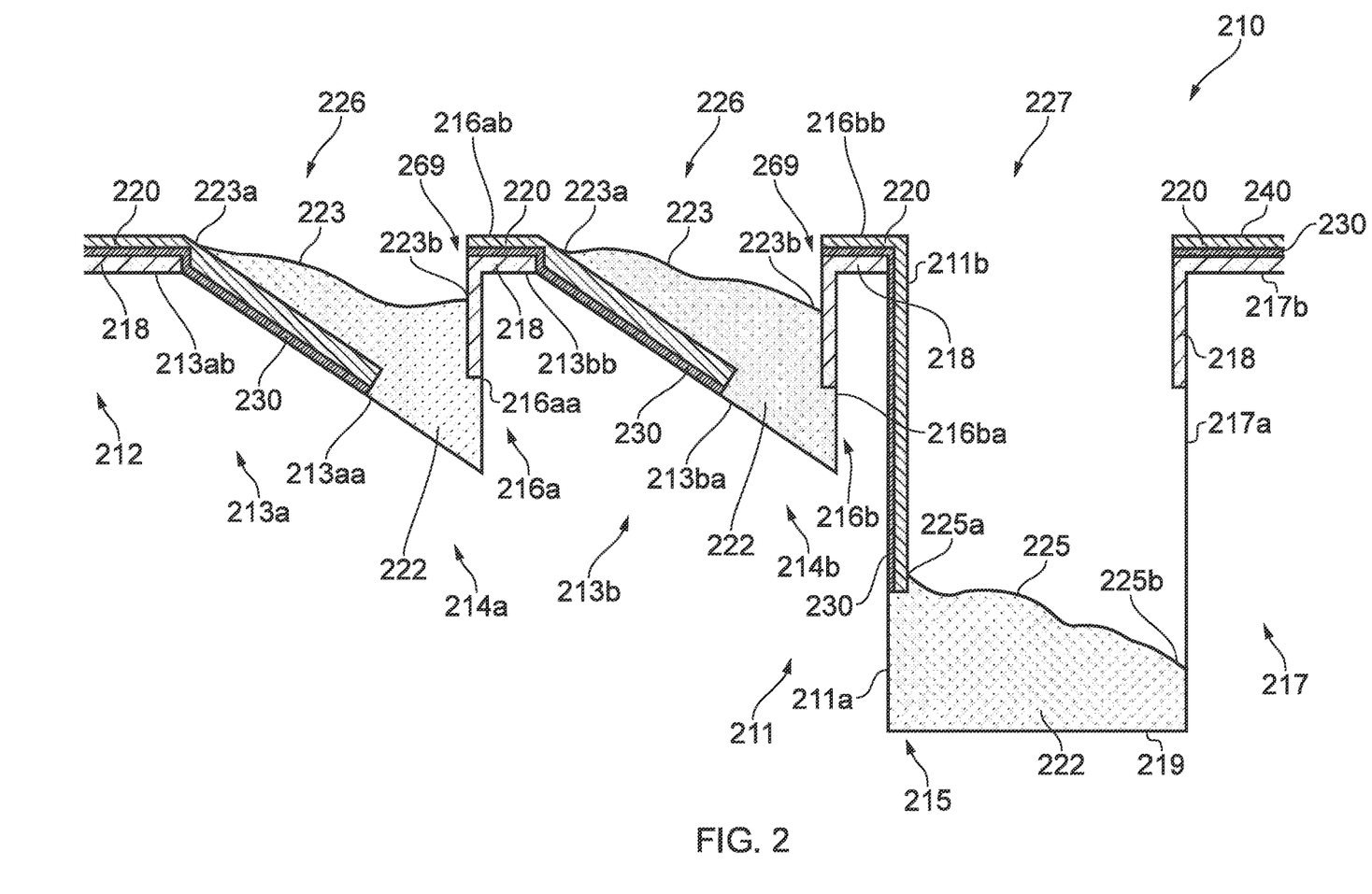
FIG. 2 is a cross-sectional view of a groove and a channel of an optoelectronic device according to a second embodiment of the present invention.

FIG. 2 shows a second embodiment of an optoelectronic device 210. Where the features are the same as the previous embodiment, the reference numbers are the same except preceded by a "2". The optoelectronic device 210 comprises a substrate 212 and two asymmetric v-shaped grooves 214a, 214b and a channel 215. Each groove 214a, 214b comprises a first side 213a, 213b and a second side 216a, 216b. Each first side 213a, 213b comprises a first face 213aa, 213ba and a first surface 213ab, 213bb. Each second side 216a, 216b comprises a second face 216aa, 216ba and a second surface 216ab, 216bb.

Each groove 214a, 214b further comprises a conductor material 218, a semiconductor material 220, and another semiconductor material 222.

The first and second sides 213, 216 of each groove 214a, 214b are each coated with an adhesive material 230. The adhesive material 230 is a layer of adhesive material. A layer of semiconductor material 220 is on top of a layer of conductor material 218; and the layer of conductor material 218 is underneath the layer of semiconductor material 220. The layer of adhesive material 230 is underneath the layer of semiconductor material 220 and on top of the layer of conductor material 218.

The first 213aa, 213ba and second 216aa, 216ba face defines a cavity 226 of each groove 214a, 214b therebetween. The second faces 216aa, 216ba are perpendicular to the plane of the substrate 212, that is they are at a 90° angle relative to a normal from the substrate 212.

The second side 216a of the groove 214a comprises a second surface 216ab of the substrate 212 adjacent the groove 214a. The first side 213b of the groove 214b comprises a first surface 213bb of the substrate 212 adjacent the groove 214b. The second surface 216ab of the substrate 212 adjacent the groove 214a is the same as the first surface 213bb of the substrate 212 adjacent the groove 214b.

The depth 223b of the another semiconductor material 222 in each groove 214a, 214b at the second face 216aa, 216ba is greater than the depth 223a of the another semiconductor material 222 at the first face 213aa, 213ba. The surface 223 of the another semiconductor 222 is at an angle, or tilted, with respect to the plane of the substrate 212. The surface 223 of the another semiconductor 222 is tilted relative to the groove 214.

At the second side 216a, 216b of each groove 214a, 214b there is a gap, an air gap 269, between the semiconductor material 220 on the second side 216a, 216b of each groove 214a, 214b and the another semiconductor material 222 in each groove.

The gap 269 between the semiconductor material 220 and the another semiconductor material 222 at the second side 216a, 216b of each groove 214a, 214b means that the another semiconductor material 222 is insulated from the semiconductor material 220.

The channel 215 is a delineation feature. The channel 215 has a first 211 and a second 217 side. The first side 211 of the channel 215 comprises a first face 211a of the channel 215 and a first surface 211b of the substrate 212 adjacent the channel 215. The second side 217 of the channel 215 comprises a second face 217a of the channel 215 and a second surface 217b of the substrate 212 adjacent the channel 215.

The second side 216b of the groove 214b comprises a second surface 216bb of the substrate 212 adjacent the groove 214b. The second surface 216bb of the substrate 212 adjacent the groove 214b is the same as the first surface 211b of the substrate 212 adjacent the channel 215.

The first face 211a of the channel 215 and the second face 217a of the channel 215 are both perpendicular to the plane of the substrate 212, that is they are at a 90° angle relative to a normal from the substrate 212. The channel 215 is square shaped, such that the first 211a and second 217a faces of the channel 215 separately contact a base 219 of the channel 215 and define a channel cavity 227 between the first 211a and second 217a faces of the channel 215.

A conductor material 218 is in contact with the second face 217a of the channel 215 and second surface 217b of the substrate 212 adjacent the channel 215. The conductor material 218 is also in contact with the first surface 211b of the substrate 212 adjacent the channel 215. A semiconductor material 220 is coated on the first face 211a of the channel 215 and on the first surface 211b of the substrate 212 adjacent the channel 215, on top of the adhesive layer 230. The semiconductor material 220 is also coated on the second surface 217b of the substrate 212 adjacent the channel 215, on top of the adhesive layer 230.

The depth 225b of the another semiconductor material 222 in the channel 215 at the second face 217a is less than the depth 225a of the another semiconductor material 222 at the first face 211a. The surface 225 of the another semiconductor 222 is at an angle, or tilted, with respect to the plane of the substrate 212.

There is no electrical communication between the conductor material 218 on the second side 217a of the channel 215, semiconductor material 220 on the first side 211a of the channel 215, and the another semiconductor material 222 in the channel 215. The channel 215 therefore insulates the first 211 and second 217 sides of the channel 215 from one another.

The depth of the channel 215 is twice the depth of the grooves 214a, 214b as measured from an upper surface 240 of the substrate 212 to a point in the channel 215 or groove 214a, 214b furthest from the upper surface 240.

Modifications and improvements can be incorporated herein without departing from the scope of the invention.

The invention claimed is:

1. An optoelectronic device comprising:
   a substrate comprising a groove having a first face and a second face, wherein the first face of the groove is longer than the second face of the groove or the second face of the groove is longer than the first face of the groove;

wherein a first side of the groove comprises the first face of the groove and a first surface of the substrate adjacent the groove;

wherein a second side of the groove comprises the second face of the groove and a second surface of the substrate adjacent the groove;

wherein the first face of the groove is partially coated with a first layer comprising a first semiconductor material and the second face of the groove is partially coated with a second layer comprising a conductor material;

wherein the first layer comprising the first semiconductor material further coats the first surface of the substrate adjacent the groove;

wherein the second layer comprising the conductor material further coats the second surface of the substrate adjacent the groove;

wherein a second semiconductor material is in the groove such that the conductor material and the first semiconductor material are both in contact with the second semiconductor material in the groove; and wherein the second side of the groove is partially coated with the first layer comprising the first semiconductor material, wherein the first layer is on top of the second layer, and wherein there is a gap between the first semiconductor material on the second side of the groove and the second semiconductor material in the groove.

2. The optoelectronic device according to claim 1, wherein the first face of the groove is longer than the second face of the groove.

3. The optoelectronic device according to claim 1, wherein the first face of the groove is at least twice as long as the second face of the groove.

4. The optoelectronic device according to claim 1, wherein the first face of the groove is at least 500 nm long and the second face of the groove is at least 100 nm long.

5. The optoelectronic device according to claim 1, wherein the groove has an asymmetric shape.

6. The optoelectronic device according to claim 1, wherein the gap is an air gap.

7. The optoelectronic device according to claim 1, wherein the gap between the first semiconductor material on the second side of the groove and the second semiconductor material at the second side of the groove is at least 10 nm in length.

8. The optoelectronic device according to claim 1, wherein the gap between the first semiconductor material and the second semiconductor material mitigates a charge transfer path from the first semiconductor material on the first side of the groove, through the second semiconductor material, and into the first semiconductor material on the second side of the groove.

9. The optoelectronic device according to claim 1, wherein the second semiconductor material at least partially fills the groove between the first face of the groove and the second face of the groove.

10. The optoelectronic device according to claim 1, wherein the second semiconductor material has a surface that is inclined or declined relative to a normal from the substrate.

11. The optoelectronic device according to claim 1, wherein the groove has a volume and the second semiconductor material occupies from 15 to 75% of the volume of the groove.

12. The optoelectronic device according to claim 1, wherein the first semiconductor material covers from 40 to 60% of the first face of the groove.

13. The optoelectronic device according to claim 1, wherein the conductor material covers from 40 to 60% of the second face of the groove.

14. The optoelectronic device according to claim 1, wherein the first semiconductor material is an n-type semiconductor material and the second semiconductor material is a p-type semiconductor material.

15. The optoelectronic device according to claim 1, wherein the first semiconductor material and the second semiconductor material are different materials so as to provide ohmic and rectifying contacts.

16. The optoelectronic device according to claim 1, wherein the substrate comprises a first series of grooves, a second series of grooves, and a channel between the first series of grooves and the second series of grooves, the groove of claim 1 being any one of the grooves of the first series of grooves or the second series of grooves.

17. The optoelectronic device according to claim 16, wherein the first series of grooves comprises a plurality of grooves, the second series of grooves comprises a plurality of grooves, wherein each of the plurality of grooves within the first series of grooves and the second series of grooves extends from a first end to a second end, and wherein the channel transects the each of the plurality of grooves of the first series of grooves towards the first end of each of the plurality of grooves, passes between the first series of grooves and the second series of grooves, and transects each of the plurality of grooves of the second series of grooves towards the second end of each of the plurality of grooves.

18. The optoelectronic device according to claim 16, wherein the channel has a depth, each of the plurality of grooves of the first series of grooves has a depth, and each of the plurality of grooves of the second series of grooves has a depth, wherein the depth of each of the plurality of grooves within the first series of grooves is substantially the same as the depth of each of the plurality of grooves within the second series of grooves, and the depth of the channel is at least twice the depth of each of the plurality of grooves of the first series of grooves.

19. The optoelectronic device according to claim 1, wherein the first surface of the substrate adjacent the groove is further coated with a third layer comprising an insulator material, wherein the third layer is on top of the first layer.

20. The optoelectronic device according to claim 1, wherein the optoelectronic device is a solar photovoltaic cell.

* * * * *